(12) United States Patent
Chen

(10) Patent No.: US 8,779,733 B2
(45) Date of Patent: Jul. 15, 2014

(54) BOOTSTRAP SCHEME FOR BULK-BOOST CONVERTER

(75) Inventor: Chih-Ning Chen, Taipei (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 215 days.

(21) Appl. No.: 13/593,521

(22) Filed: Aug. 24, 2012

(65) Prior Publication Data

US 2013/0265024 A1    Oct. 10, 2013

(30) Foreign Application Priority Data

Apr. 5, 2012  (TW) .............................. 101112045 A

(51) Int. Cl.
*G05F 1/00* (2006.01)
*H03K 3/00* (2006.01)
*H03B 1/00* (2006.01)
*G05F 1/24* (2006.01)

(52) U.S. Cl.
USPC ............................ 323/259; 327/109; 323/282

(58) Field of Classification Search
USPC ........... 323/282–285, 259; 327/108–109, 111
See application file for complete search history.

(56) References Cited

U.S. PATENT DOCUMENTS

| 7,368,957 B2 * | 5/2008 | Clarkin et al. | 323/259 |
| 7,504,868 B2 * | 3/2009 | Bodano et al. | 323/282 |
| 8,013,642 B2 * | 9/2011 | Nakagawa | 327/108 |
| 2008/0290911 A1 * | 11/2008 | Williams | 327/109 |

* cited by examiner

*Primary Examiner* — Jue Zhang
(74) *Attorney, Agent, or Firm* — Winston Hsu; Scott Margo

(57) ABSTRACT

A bootstrap circuit for a voltage converter includes a bootstrap capacitor, a stable current module for generating a stable output current according to a stable output voltage, a current mirror module having a first branch circuit for generating a current signal according to the stable output current, and a charge module including a cascode transistor module including a plurality of transistors serially connected and a charge resistor for generating a conduction voltage according to the current signal, and an output circuit coupled to the current mirror module and the cascode transistor module for outputting the conduction voltage to charge the bootstrap capacitor.

20 Claims, 6 Drawing Sheets

BOOTSTRAP SCHEME FOR BULK-BOOST CONVERTER

BACKGROUND OF THE INVENTION

1. Field of the Invention

The present invention relates to a bootstrap circuit for a voltage converter, and more particularly, to a bootstrap circuit for a voltage converter which can maintain a charge voltage for a bootstrap capacitor as well as detect a voltage value of the bootstrap capacitor.

2. Description of the Prior Art

Electronic devices usually have different composing elements which operate with different operational voltages. Thus, it is necessary to utilize different DC-DC voltage converters in order to achieve different voltage modulations, such as modulation for raising voltage values or degradation voltage values, and to maintain them at predetermined voltage values. Many types of DC-DC voltage converters have been widely developed and are derived from the buck/step down converter or the boost/step up converter. The buck converter can decrease an input DC voltage to a default voltage level, and the boost converter can increase the input DC voltage to another default voltage level. With development, both the buck and boost converters are varied and modified to conform to different system architectures and requirements.

Please refer to FIG. 1, which illustrates a conventional schematic diagram of a voltage converter 10. As shown in FIG. 1, the voltage converter 10 includes a driver 100, a bootstrap circuit 102, a switch element SWM, an inductor L1, a bootstrap capacitor CBOOT, a diode D1 and an output capacitor COUT. The driver 100 controls a conduction condition of the switch element SWM, so as to utilize the bootstrap circuit 102 to control a charge condition of the bootstrap capacitor CBOOT, i.e. voltage differences between two terminal points BOOT and LX. Lastly, the diode D1 and the output capacitor COUT stably transform an input voltage VIN into an output voltage VOUT for outputting. However, during the transformation process, the terminal point LX may possibly generate a relatively negative voltage value, so as to meet difficulty in voltage modulation of the bootstrap circuit 102, or to damage the bootstrap capacitor CBOOT. Besides, a period corresponding to voltage changes of the terminal point LX can be extremely short, and the bootstrap circuit 102 may not immediately output a control signal (not shown in figure) to control the charge condition of the bootstrap capacitor CBOOT.

Therefore, it has become an important issue to provide another bootstrap circuit for the voltage converter, so as to control the terminal voltage value of the bootstrap capacitor and the conduction condition thereof.

SUMMARY OF THE INVENTION

It is therefore an objective of the invention to provide a bootstrap circuit for a voltage converter.

The present invention discloses a bootstrap circuit for a voltage converter including a bootstrap capacitor, a stable current module for generating a stable output current according to a stable output voltage, a current mirror module comprising a first branch circuit for generating a current signal according to the stable output current, and a charge module including a cascode transistor module comprising a plurality of transistors serially connected and a charge resistor for generating a conduction voltage according to the current signal, and an output circuit coupled to the current mirror module and the cascode transistor module for outputting the conduction voltage to charge the bootstrap capacitor.

The present invention also discloses another bootstrap circuit for a voltage converter including a bootstrap capacitor, a stable current module for generating a stable output current according to a stable output voltage, a current mirror module comprising a first branch circuit for generating a current signal according to the stable output current, and a detection module coupled to the first branch circuit and the bootstrap capacitor for generating a detection signal according to the current signal and a conduction current of the bootstrap capacitor.

The present invention also discloses another bootstrap circuit for a voltage converter including a bootstrap capacitor, a stable current module for generating a stable output current according to a stable output voltage, a current mirror module comprising a first branch circuit, a second branch circuit and a third branch circuit for generating a plurality of current signals of the first branch circuit, the second branch circuit and the third branch circuit according to the stable output current, a charge module including a cascode transistor module comprising a plurality of transistors serially connected, a charge resistor and a switch element for generating a conduction voltage according to the current signal of the first branch circuit, and an output circuit comprising a plurality of transistors coupled to the current mirror module and the cascode transistor module for outputting the conduction voltage to charge the bootstrap capacitor, and a detection module coupled to the second branch circuit, the third branch circuit, the charge module and the bootstrap capacitor for generating a short-circuit detection signal, a raising-voltage detection signal and a conduction signal according to a conduction current of the bootstrap capacitor and the plurality of current signals of the second branch circuit and the third branch circuit.

The present invention also discloses another voltage converter including an input terminal for receiving an input voltage, an output terminal for outputting an output voltage, a bootstrap circuit including a bootstrap capacitor, a stable current module for generating a stable output current according to a stable output voltage, a current mirror module comprising a first branch circuit, a second branch circuit and a third branch circuit for generating a plurality of current signals of the first branch circuit, the second branch circuit and the third branch circuit according to the stable output current, a charge module including a cascode transistor module comprising a plurality of transistors serially connected, a charge resistor and a switch element for generating a conduction voltage according to the current signal of the first branch circuit, and an output circuit including a plurality of transistors coupled to the current mirror module and the cascode transistor module for outputting the conduction voltage to charge the bootstrap capacitor, and a detection module coupled to the second branch circuit, the third branch circuit, the charge module and the bootstrap capacitor for generating a short-circuit detection signal, a raising-voltage detection signal and a conduction signal according to a conduction current of the bootstrap capacitor and the plurality of current signals of the second branch circuit and the third branch circuit, a controller coupled to the bootstrap circuit for receiving the short-circuit detection signal, the raising-voltage detection signal or the conduction signal to generate a periodical operation signal, a gate driver coupled to the controller and the bootstrap circuit for receiving the periodical operation signal to generate a gate-control signal, a driver circuit including one end for receiving the input voltage and another end coupled to an inductor for determining an conduction condition of the driver circuit according to the gate-control signal, a diode including one end coupled to the driver circuit and another end coupled to the output terminal and an output capacitor, a feedback module coupled to the output terminal for generating a feedback signal according to the output voltage, an error amplifier coupled to the feedback module for generating an amplification signal according to the feedback signal and a reference voltage, a pulse width modulation compensation circuit coupled to the error amplifier for generating a compensation result according to the amplification signal, a slope generation circuit for generating a slope wave signal, and a pulse width modulation comparator coupled to the slope generation circuit and the pulse width modulation compensation circuit for generating a pulse width modulation signal according to the slope wave signal and the compensation result to transmit to the controller.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
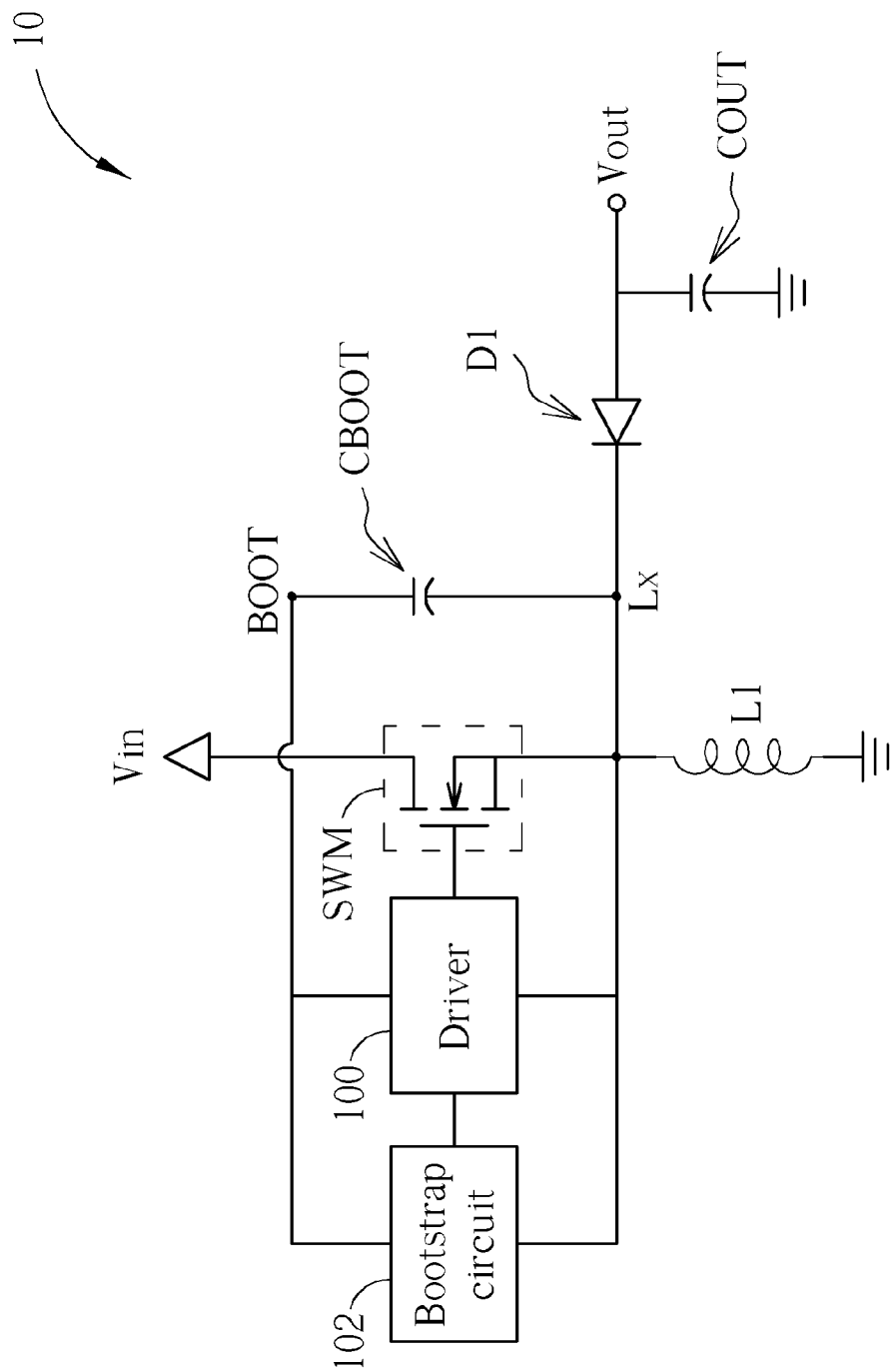
FIG. 1 illustrates a conventional schematic diagram of a voltage converter.
Figure 2:
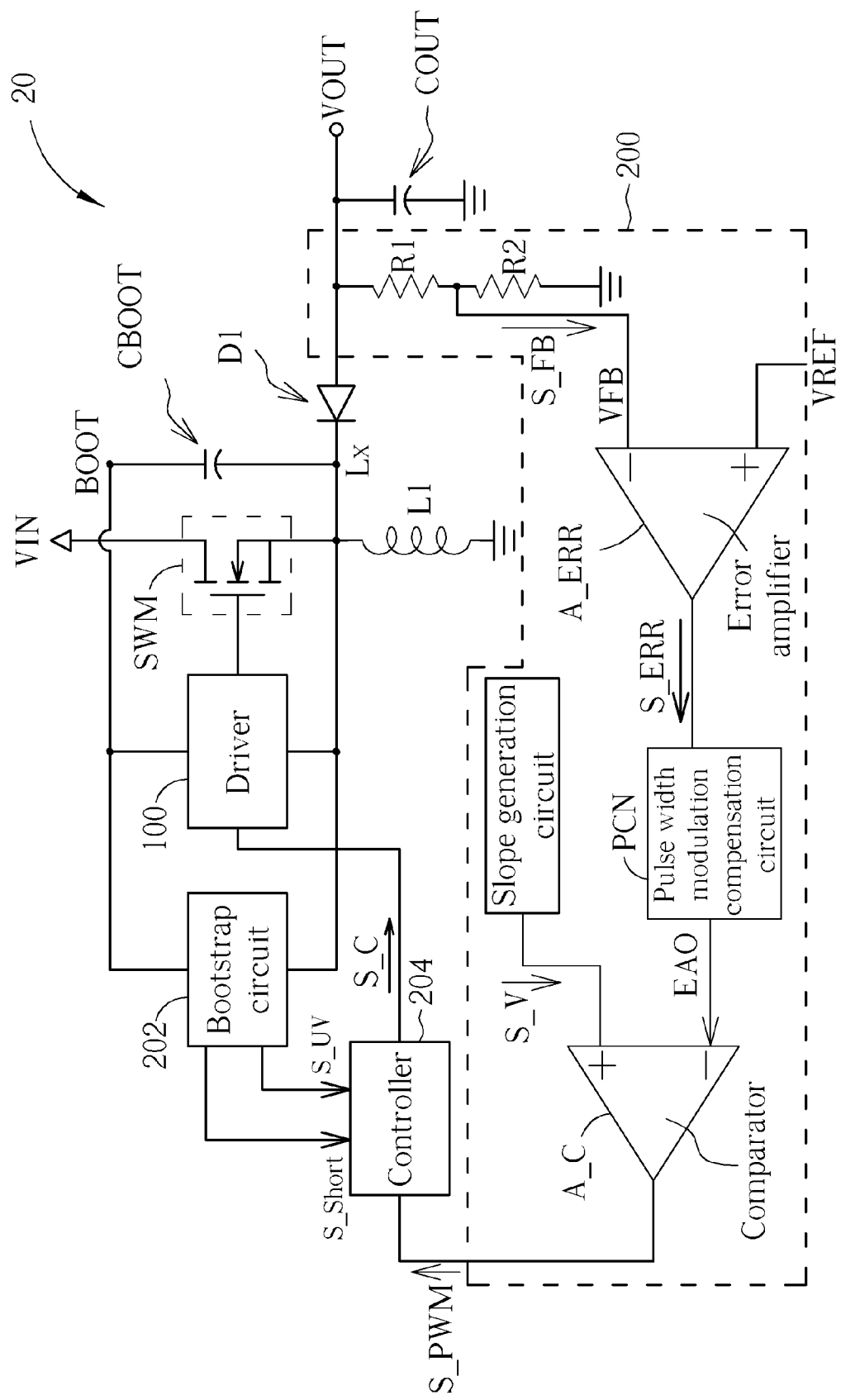
FIG. 2 illustrates a schematic diagram of a voltage converter according to an embodiment of the invention.

Please refer to FIG. 2, which illustrates a schematic diagram of a voltage converter 20 according to an embodiment of the invention. Noticeably, the voltage converter 20 is similar to the voltage converter 10 in FIG. 1, but the voltage converter 20 further includes a feedback module 200 and a controller 204. The voltage converter 20 includes a bootstrap circuit 202 which is not equivalent to the bootstrap circuit 102 of the voltage converter 10, and has different logical operation as well as schematic diagrams to be identified with different symbol. The other elements, nevertheless, share the same symbol with the voltage converter 10 to have the identical operations, which is not described hereinafter.

In detail, the feedback module 200 includes resistors R1, R2, an error amplifier A_ERR, a pulse width modulation compensation circuit PCN, a slope generation circuit OSC and a comparator A_C. The feedback module 200 utilizes the resistors R1, R2 to transform the output voltage VOUT into a feedback signal S_FB. The error amplifier A_ERR compares the feedback signal S_FB and a reference voltage VREF to generate an error signal S_ERR, and the pulse width modulation compensation circuit PCN transforms the error signal S_ERR into a compensation result EAO. The slope generation circuit OSC generates a slope wave signal S_V, and the comparator A_C compares the compensation result EAO and the slope wave signal S_V to correspondingly generate a pulse width modulation signal S_PWM. The bootstrap circuit 202 generates a short-circuit detection signal S_Short or a raising-voltage detection signal S_UV according to a conduction condition of the bootstrap capacitor CBOOT. The controller 204 receives the pulse width modulation signal S_PWM, the short-circuit detection signal S_Short and the raising-voltage detection signal S_UV to generate a control signal S_C to a gate driver 100, so as to control the conduction condition of the switch element SWM and process a charge operation for the bootstrap capacitor CBOOT.

Figure 3:
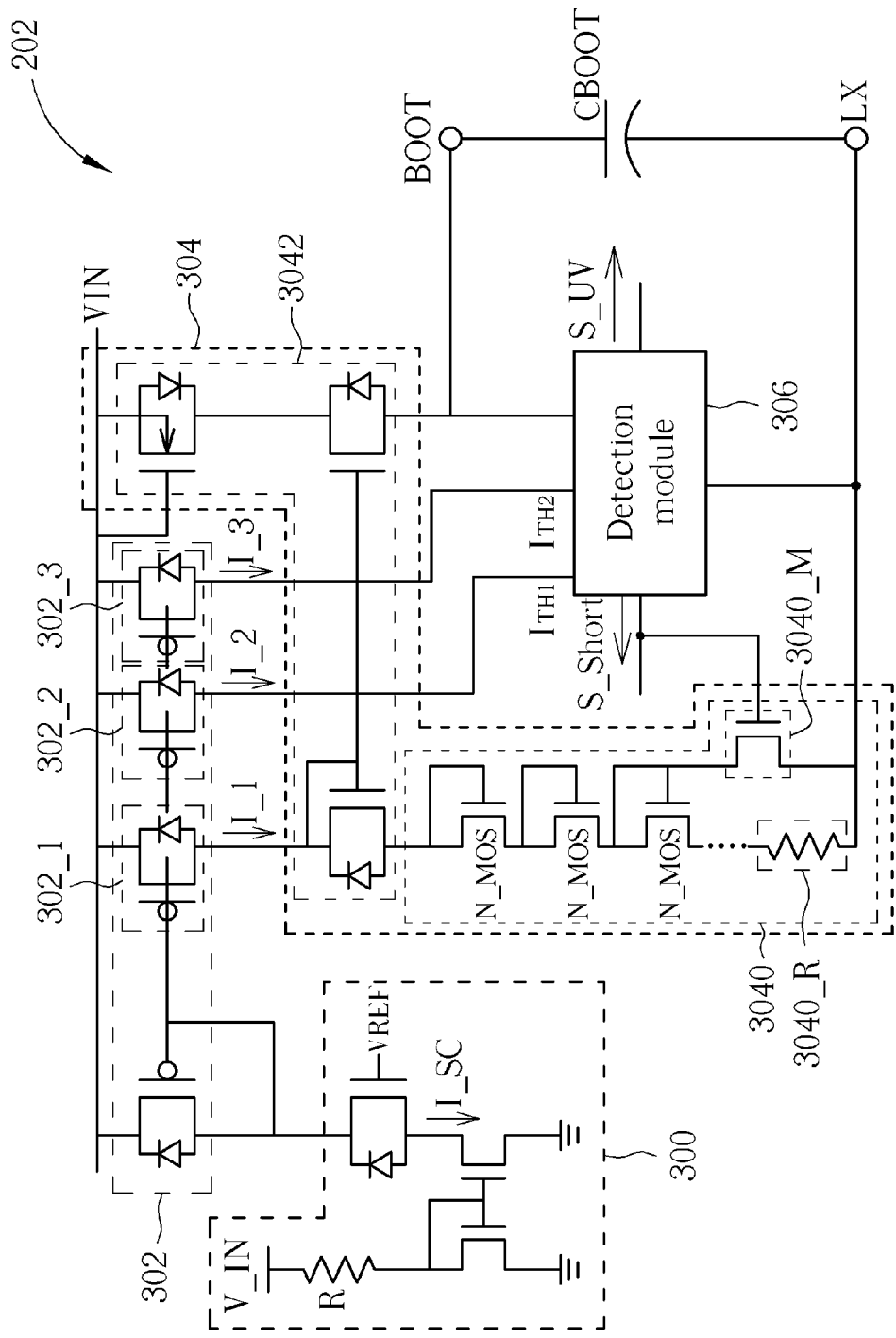
FIG. 3 illustrates a detailed schematic diagram of the bootstrap circuit coupled to the bootstrap capacitor shown in FIG. 2 according to an embodiment of the invention.

Please refer to FIG. 3, which illustrates a detailed schematic diagram of the bootstrap circuit 202 coupled to the bootstrap capacitor CBOOT shown in FIG. 2 according to an embodiment of the invention. As shown in FIG. 3, the bootstrap circuit 202 includes a stable current module 300, a current mirror module 302, a charge module 304 and a detection module 306. The stable current module 300 utilizes an internal voltage source V_IN to generate a stable current I_SC. The current mirror 302 includes a first branch circuit 302_1, a second branch circuit 302_2 and a third branch circuit 302_3. In the embodiment, the first branch circuit 302_1, the second branch circuit 302_2 and the third branch circuit 302_3 can be realized via three transistors, and areas/sizes of the three transistors can be adaptively adjusted to form currents I_1, I_2 and I_3 passing through the first branch circuit 302_1, the second branch circuit 302_2 and the third branch circuit 302_3, respectively. The charge module 304 includes a cascode transistor module 3040 and an output circuit 3042. The cascode transistor module 3040 includes n number of transistors N_MOS, a charge resistor 3040_R and a switch element 3040_M. Each of the transistors N_MOS is an N-type transistor including a threshold voltage Vth, and is cascode-serial connected to each other. The cascode transistor module 3040 has one end coupled to the first branch circuit 302_1 via part of the output circuit 3042, and another end coupled to the charge resistor 3040_R as well as the switch element 3040_M. The charge resistor 3040_R is connected to the detection module 306 and includes a resistance n×R, wherein the symbol n is an integer and the symbol R can be determined through different users' requirement. The switch element 3040_M is a transistor as well to include a gate connected to the detection circuit 306. The output circuit 3042 is connected between the current mirror module 302 and the detection module 306, so as to copy the current I_1 passing through the first branch circuit 302_1 to be transmitted to the bootstrap capacitor CBOOT. The detection module 306 is connected to the second branch circuit 302_2 and the third branch circuit 302_3, and is connected to the bootstrap capacitor CBOOT via the two terminal points BOOT and LX.

In detail, the n number of transistors NMOS and the charge resistor 3040_R generate a terminal voltage difference $V_{BOOT-LX}$ as a product of a symbol n with the internal voltage source V_IN at the terminal points BOOT and LX according to the formula $$V_{BOOTLX} = \frac{(V\_IN - Vth)}{R} \times (n \times R) + n \times Vth = n \times V\_IN,$$

so as to generate a fixed voltage value to directly charge the bootstrap capacitor CBOOT. Under such circumstances, the terminal voltage difference $V_{BOOT-LX}$ is only related to the internal voltage source V_IN, and demonstrated as a fixed voltage source being outputted without changes. Therefore, the terminal point LX of the bootstrap capacitor CBOOT can avoid the drawback of the prior art, which generates the relatively negative voltage value or is over a voltage modulation range while modulating voltage values of the terminal point.

Figure 4A:
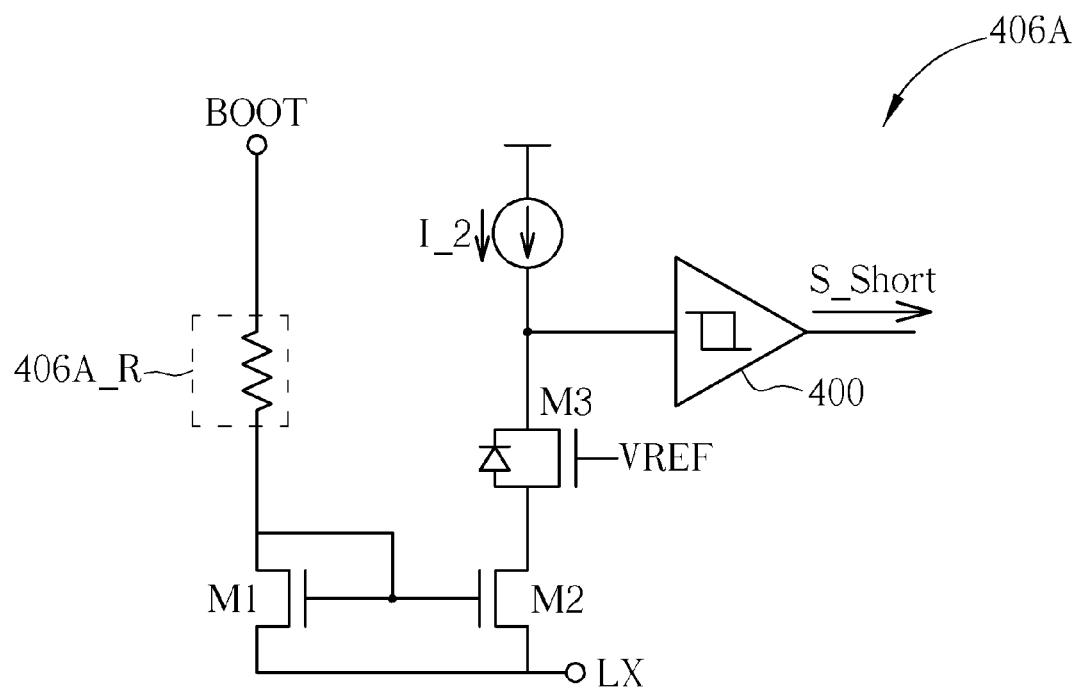
FIG. 4A illustrates a detailed schematic diagram of the detection module in FIG. 3 according to an embodiment of the invention.

While the cascode transistor module 3040 charges the bootstrap capacitor CBOOT, the detection module 306 simultaneously detects the terminal voltage difference $V_{BOOT\text{-}LX}$ of the bootstrap capacitor CBOOT. For example, please refer to FIG. 4A, which illustrates a detailed schematic diagram of the detection module 306 in FIG. 3 according to an embodiment of the invention. As shown in FIG. 3 and FIG. 4A, the detection module 406A includes transistors M1, M2, M3 and a resistor 406A_R with a resistance R. The transistor M3 conducts the second branch circuit 302_2 with the current I_2, and the transistors M1, M2 and the resistor 406A_R copy the current of the terminal point LX as a first predetermined current $I_{TH1}$. When the voltage converter 20 just initiates, or the charge process of the terminal voltage difference $V_{BOOT\text{-}LX}$ has not completed or values of the terminal voltage difference $V_{BOOT\text{-}LX}$ decrease due to the charge process, so as to match the formula $$I_{TH1} = \frac{(V_{BOOT} - Vth)}{R} = \frac{(V\_IN - Vth)}{R}$$

and to derive $V_{BOOT}=V\_IN$, which means the voltage of the terminal point BOOT $V_{BOOT}$ is equivalent to the internal voltage source V_IN or the terminal voltage difference $V_{BOOT\text{-}LX}$ is smaller than the internal voltage source V_IN, the detection module 406A will determine that a short-circuit conduction path occurs between the terminal points BOOT and LX. Under such circumstances, the detection module 406A utilizes a comparator 400, such as a Schmitt trigger, to output the short-circuit detection signal S_Short to the controller 204, so as to correspondingly lower the terminal voltage difference $V_{BOOT\text{-}LX}$ of the bootstrap capacitor CBOOT, such as the double threshold voltage Vth. The double threshold voltage Vth is not smaller than the internal voltage source V_IN, which can avoid elements of the output circuit 3042 overheating or being damaged.

Figure 4B:
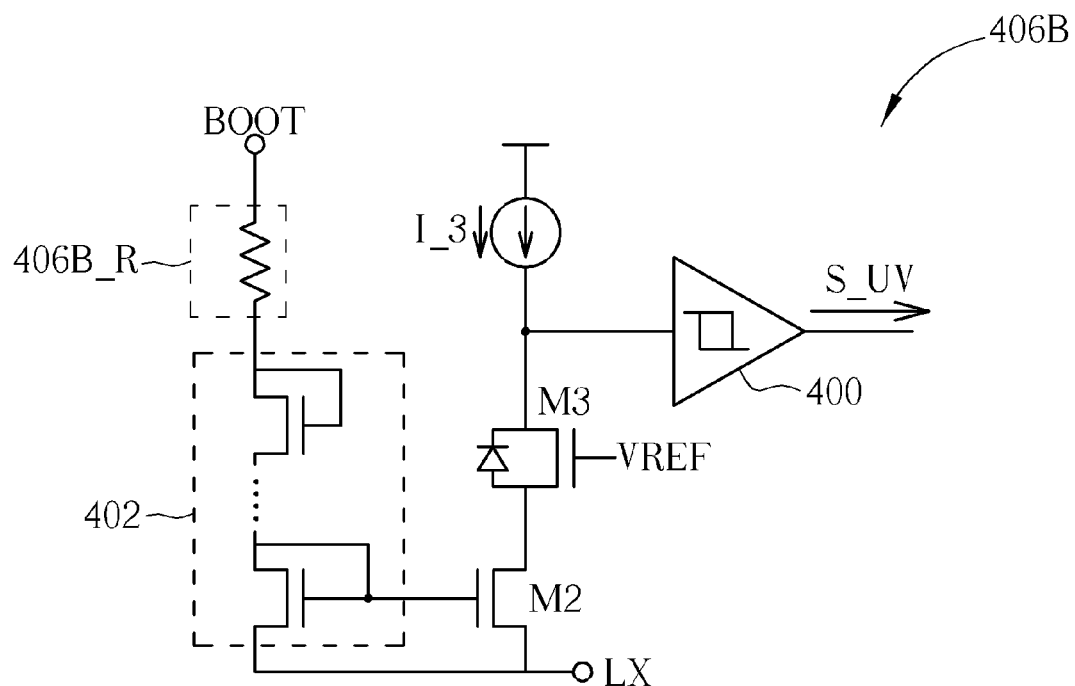
FIG. 4B illustrates a detailed schematic diagram of another detection module in FIG. 3 according to an embodiment of the invention.

Please refer to FIG. 4B, which illustrates a detailed schematic diagram of another detection module 306 in FIG. 3 according to an embodiment of the invention. In comparison with FIG. 4A, the detection module 406B utilizes another cascode transistor module 402, which has m number of transistors M1 serially connected, to replace the transistor M1 shown in FIG. 4A. Also, the detection module 406B has another resistor 406B_R with a resistance m×R, wherein the symbol m is an arbitrary integer. The other elements of the detection module 406B are directly inherited from the detection module 406A for the same functional operation, and follow the same symbols of the detection module 406A. Noticeably, in the embodiment, the transistor M3 conducts the third branch circuit 302_3 with the current I_3, and the transistors M2, the cascode transistor module 402 and the resistor 406A_R copy the current of the terminal point BOOT as a second predetermined current $I_{TH2}$. When the formula $$I_{TH2} = \frac{(V_{BOOT} - m \times Vth)}{mR} = \frac{(V\_IN - Vth)}{R}$$

can be met to have $V_{BOOT}=m\times V\_IN$, which means the voltage of the terminal point BOOT is m times the internal voltage source V_IN, the comparator 400 is utilized to output the raising-voltage detection signal S_UV to the controller 204. Then, the bootstrap capacitor CBOOT is determined as an uncompleted charge process, and is continuously charged by the cascode transistor module 3040.

Figure 5:
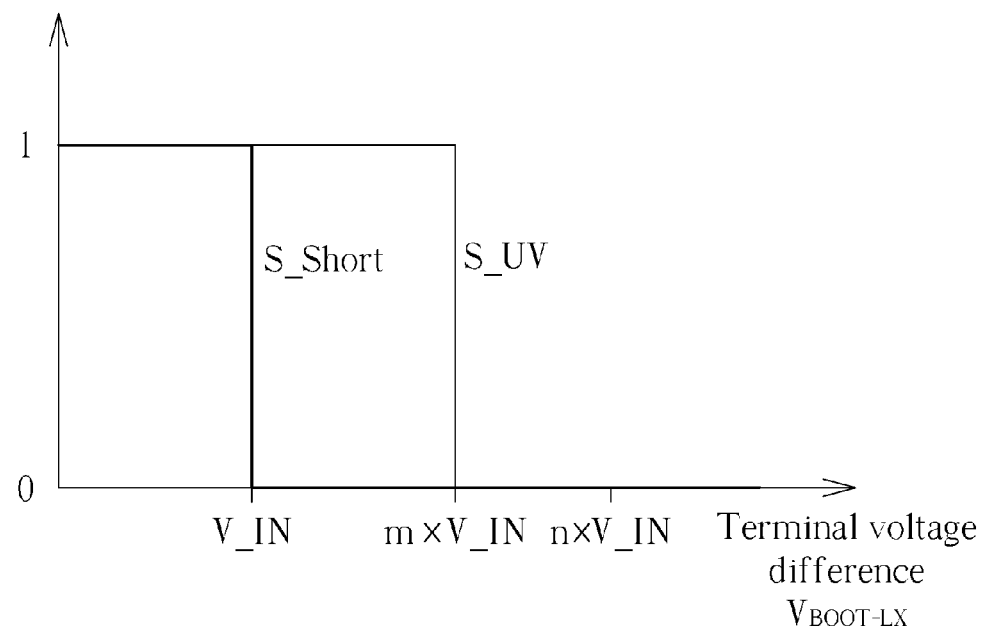
FIG. 5 illustrates a schematic diagram of the terminal voltage difference of the bootstrap capacitor corresponding to the control signal outputted by the controller according to an embodiment of the invention.

In simple, the bootstrap circuit 202 utilizes the stable current module 300 and the current mirror module 302 to provide a current source (i.e. the internal voltage source V_IN) to the charge module 304 without external interference. Next, the charge module 304 charges the bootstrap capacitor CBOOT with a stable charge voltage value. Under such circumstances, the detection module 306 is utilized to simultaneously monitor the terminal voltage difference $V_{BOOT\text{-}LX}$ of the bootstrap capacitor CBOOT, so as to control the conduction condition of the switch element SWM of the voltage converter 20. Please refer to FIG. 5, which illustrates a schematic diagram of the terminal voltage difference $V_{BOOT\text{-}LX}$ of the bootstrap capacitor CBOOT corresponding to the control signal outputted by the controller 204 according to an embodiment of the invention. As shown in FIG. 5, when the terminal voltage difference $V_{BOOT\text{-}LX}$ of the bootstrap capacitor CBOOT corresponds to different values, such as a product of 1, m or n with the internal voltage source V_IN, the detection module 306 can output the short-circuit detection signal S_Short, the raising-voltage detection signal S_UV or a conduction signal, respectively, to determine whether the bootstrap capacitor CBOOT is in a short-circuit mode, an uncompleted charge mode or an enabling-discharge mode.

Figure 6:
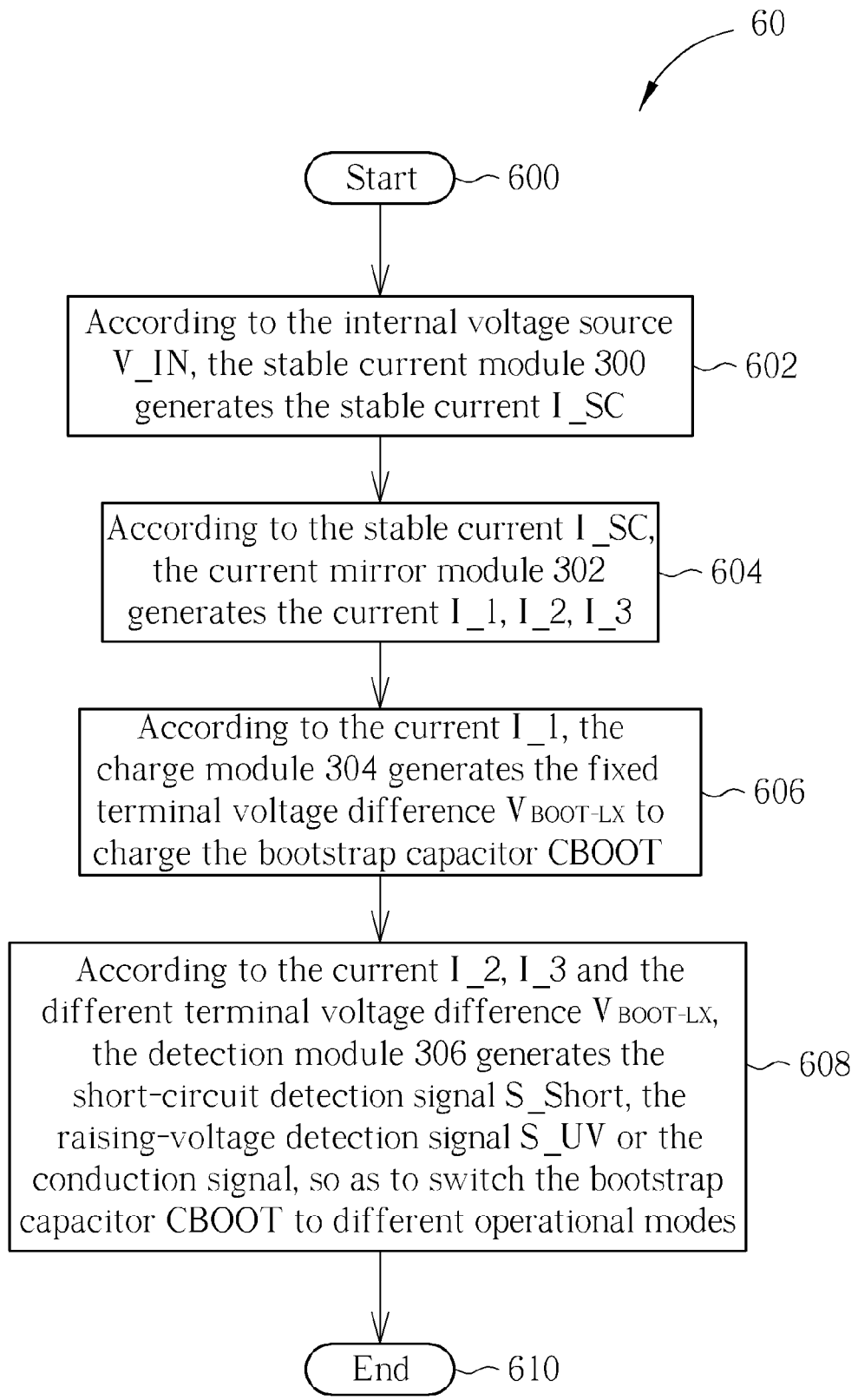
FIG. 6 illustrates a flow chart of a charge process according to an embodiment of the invention.

Further, the bootstrap circuit 202 of the voltage converter 20 charging the bootstrap capacitor CBOOT can be summarized as a charge process 60, as shown in FIG. 6. The charge process 60 includes the steps as follows:

Step 600: Start.

Step 602: According to the internal voltage source V_IN, the stable current module 300 generates the stable current I_SC.

Step 604: According to the stable current I_SC, the current mirror module 302 generates the current I_1, I_2, I_3.

Step 606: According to the current I_1, the charge module 304 generates the fixed terminal voltage difference $V_{BOOT\text{-}LX}$ to charge the bootstrap capacitor CBOOT.

Step 608: According to the current I_2, I_3 and the different terminal voltage difference $V_{BOOT\text{-}LX}$, the detection module 306 generates the short-circuit detection signal S_Short, the raising-voltage detection signal S_UV or the conduction signal, so as to switch the bootstrap capacitor CBOOT to different operational modes.

Step 610: End.

The detailed steps of the charge process 60 can be understood via the voltage converter 20, the bootstrap circuit 202, FIG. 2 to FIG. 5 and related paragraphs, which is not described hereinafter. Moreover, in Step 608, the detection module 306 can utilize other predetermined current signals or built-in determination elements/modules rather than the current I_2, I_3, so as to determine when to switch operational modes of the bootstrap capacitor CBOOT. Those skilled in the art can further install other operational modes to satisfy different users' requirement, which is not limited by the embodiment of the invention.

Noticeably, those skilled in the art can utilize conceptions of the bootstrap circuit 202 and the charge process 60 to combine other stable voltage modules, current (voltage) detection modules or switch elements, so as to control the voltage/current between the two terminal points BOOT and LX of the bootstrap circuit 202. Other circuit modules/elements can also be utilized to replace the transistors mentioned in the embodiment of the invention, so as to be appropriately applied to the voltage converter 20, which is also in the scope of the invention.

In summary, the invention provides a bootstrap circuit for a voltage converter. According to an internal stable voltage source, a stable current module, a current mirror module and a charge module are utilized to charge a bootstrap capacitor with a fixed voltage value. Also, a detection module can be utilized to simultaneously monitor changes of the terminal voltage difference, so as to correspondingly switch operational modes of the bootstrap capacitor. Thus, drawbacks of the prior art, such as relatively negative voltage values possibly being generated at the terminal points of the bootstrap capacitor while converting the voltage values of the terminal points or terminal voltage values being outside of the capable voltage modulation range, can be solved to adaptively control conduction conditions of the bootstrap capacitor and to expand product application of the bootstrap circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bootstrap circuit for a voltage converter comprising:
   a bootstrap capacitor;
   a stable current module for generating a stable output current according to a stable output voltage;
   a current mirror module comprising a first branch circuit for generating a current signal according to the stable output current; and
   a charge module comprising:
      a cascode transistor module comprising a plurality of transistors serially connected and a charge resistor for generating a conduction voltage according to the current signal; and
      an output circuit coupled to the current mirror module and the cascode transistor module for outputting the conduction voltage to charge the bootstrap capacitor.

2. The bootstrap circuit of claim 1, wherein each of the plurality of transistors comprises a threshold voltage, and the charge module generates the conduction voltage according to a plurality of threshold voltages of the plurality of transistors and a degradation-voltage of the charge resistor.

3. The bootstrap circuit of claim 2, wherein the conduction voltage is a product of the stable output voltage with fixed integers.

4. A bootstrap circuit for a voltage converter comprising:
   a bootstrap capacitor;
   a stable current module for generating a stable output current according to a stable output voltage;
   a current mirror module comprising a first branch circuit for generating a current signal according to the stable output current; and
   a detection module coupled to the first branch circuit and the bootstrap capacitor for generating a detection signal according to the current signal and a conduction current of the bootstrap capacitor.

5. The bootstrap circuit of claim 4, wherein the detection signal controls a conduction condition of a switch transistor and maintains a conduction voltage of the bootstrap capacitor, and the conduction voltage is larger than the stable output voltage.

6. The bootstrap circuit of claim 4, wherein the detection signal switches an operational mode of the bootstrap capacitor.

7. A bootstrap circuit for a voltage converter comprising:
   a bootstrap capacitor;
   a stable current module for generating a stable output current according to a stable output voltage;
   a current mirror module comprising a first branch circuit, a second branch circuit and a third branch circuit for generating a plurality of current signals of the first branch circuit, the second branch circuit and the third branch circuit according to the stable output current;
   a charge module comprising:
      a cascode transistor module comprising a plurality of transistors serially connected, a charge resistor and a switch element for generating a conduction voltage according to the current signal of the first branch circuit; and
      an output circuit comprising a plurality of transistors coupled to the current mirror module and the cascode transistor module for outputting the conduction voltage to charge the bootstrap capacitor; and
   a detection module coupled to the second branch circuit, the third branch circuit, the charge module and the bootstrap capacitor for generating a short-circuit detection signal, a raising-voltage detection signal and a conduction signal according to a conduction current of the bootstrap capacitor and the plurality of current signals of the second branch circuit and the third branch circuit.

8. The bootstrap circuit of claim 7, wherein the plurality of current signals of the second branch circuit and the third branch circuit are predetermined as a first threshold value and a second threshold value, respectively.

9. The bootstrap circuit of claim 8, wherein the detection module generates the short-circuit detection signal to the switch element and a controller of the voltage converter while determining the conduction current equivalent to the first threshold value.

10. The bootstrap circuit of claim 9, wherein each of the plurality of transistors comprises a threshold voltage, and the charge module outputs the conduction voltage according to the short-circuit detection signal, wherein the conduction voltage is larger than the stable output voltage as a product of the stable output voltage with fixed integers.

11. The bootstrap circuit of claim 8, wherein the detection module generates the raising-voltage detection signal to a controller of the voltage converter while determining the conduction current equivalent to the second threshold value.

12. The bootstrap circuit of claim 11, wherein each of the plurality of transistors comprises a threshold voltage, and the charge module generates the conduction voltage according to a plurality of threshold voltages of the plurality of transistors and a degradation-voltage of the charge resistor.

13. The bootstrap circuit of claim 12, wherein the conduction voltage is a product of the stable output voltage with fixed integers.

14. A voltage converter comprising:
   an input terminal for receiving an input voltage;
   an output terminal for outputting an output voltage;
   a bootstrap circuit comprising:
      a bootstrap capacitor;
      a stable current module for generating a stable output current according to a stable output voltage;
      a current mirror module comprising a first branch circuit, a second branch circuit and a third branch circuit for generating a plurality of current signals of the first branch circuit, the second branch circuit and the third branch circuit according to the stable output current;

a charge module comprising:
- a cascode transistor module comprising a plurality of transistors serially connected, a charge resistor and a switch element for generating a conduction voltage according to the current signal of the first branch circuit; and
- an output circuit comprising a plurality of transistors coupled to the current mirror module and the cascode transistor module for outputting the conduction voltage to charge the bootstrap capacitor; and a detection module coupled to the second branch circuit, the third branch circuit, the charge module and the bootstrap capacitor for generating a short-circuit detection signal, a raising-voltage detection signal and a conduction signal according to a conduction current of the bootstrap capacitor and the plurality of current signals of the second branch circuit and the third branch circuit;

a controller coupled to the bootstrap circuit for receiving the short-circuit detection signal, the raising-voltage detection signal or the conduction signal to generate a periodical operation signal;

a gate driver coupled to the controller and the bootstrap circuit for receiving the periodical operation signal to generate a gate-control signal;

a driver circuit comprising one end for receiving the input voltage and another end coupled to an inductor for determining an conduction condition of the driver circuit according to the gate-control signal;

a diode comprising one end coupled to the driver circuit and another end coupled to the output terminal and an output capacitor;

a feedback module coupled to the output terminal for generating a feedback signal according to the output voltage;

an error amplifier coupled to the feedback module for generating an amplification signal according to the feedback signal and a reference voltage;

a pulse width modulation compensation circuit coupled to the error amplifier for generating a compensation result according to the amplification signal;

a slope generation circuit for generating a slope wave signal; and a pulse width modulation comparator coupled to the slope generation circuit and the pulse width modulation compensation circuit for generating a pulse width modulation signal according to the slope wave signal and the compensation result to transmit to the controller.

15. The voltage converter of claim 14, wherein the plurality of current signals of the second branch circuit and the third branch circuit are predetermined as a first threshold value and a second threshold value, respectively.

16. The voltage converter of claim 15, wherein the detection module generates the short-circuit detection signal to the switch element and the controller while determining the conduction current equivalent to the first threshold value.

17. The voltage converter of claim 16, wherein each of the plurality of transistors comprises a threshold voltage, and the charge module outputs the conduction voltage according to the short-circuit detection signal, wherein the conduction voltage is larger than the stable output voltage as a product of the stable output voltage with fixed integers.

18. The bootstrap circuit of claim 15, wherein the detection module generates the raising-voltage detection signal to the controller while determining the conduction current equivalent to the second threshold value.

19. The bootstrap circuit of claim 18, wherein each of the plurality of transistors comprises a threshold voltage, and the charge module generates the conduction voltage according to a plurality of threshold voltages of the plurality of transistors and a degradation-voltage of the charge resistor.

20. The bootstrap circuit of claim 19, wherein the conduction voltage is a product of the stable output voltage with fixed integers.

* * * * *